US011063161B2

(12) United States Patent
Bedell et al.

(10) Patent No.: US 11,063,161 B2
(45) Date of Patent: Jul. 13, 2021

(54) MONOLITHICALLY INTEGRATED HIGH VOLTAGE PHOTOVOLTAICS WITH TEXTURED SURFACE FORMED DURING THE GROWTH OF WIDE BANDGAP MATERIALS

(71) Applicant: INTERNATIONAL BUSINESS MACHINES CORPORATION, Armonk, NY (US)

(72) Inventors: Stephen W. Bedell, Wappingers Falls, NY (US); Ning Li, White Plains, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 15/834,622

(22) Filed: Dec. 7, 2017

(65) Prior Publication Data

US 2018/0301572 A1    Oct. 18, 2018

Related U.S. Application Data

(63) Continuation of application No. 15/486,819, filed on Apr. 13, 2017.

(51) Int. Cl.
*H01L 31/0236* (2006.01)
*H01L 31/18* (2006.01)
(Continued)

(52) U.S. Cl.
CPC .. *H01L 31/02363* (2013.01); *H01L 31/03044* (2013.01); *H01L 31/03048* (2013.01);
(Continued)

(58) Field of Classification Search
CPC ....... H01L 31/035209; H01L 31/02363; H01L 31/035281; H01L 31/03044;
(Continued)

(56) References Cited

U.S. PATENT DOCUMENTS

| 2003/0155574 | A1* | 8/2003 | Doolittle | ............. | H01L 31/0304 |
| | | | | | 257/77 |
| 2007/0120141 | A1* | 5/2007 | Moustakas | .......... | H01L 31/1852 |
| | | | | | 257/103 |

(Continued)

OTHER PUBLICATIONS

Gao et al, Enhancement of the light output power of InGaN/GaN light-emitting diodes grown on pyramidal patterned sapphire substrates in the micro- and nanoscale, Jan. 2008, J Appl. Phys. (103) 014314, 1-5. (Year: 2008).*

(Continued)

*Primary Examiner* — Andrew J Golden
(74) *Attorney, Agent, or Firm* — Tutunjian & Bitetto, P.C.; Erik Johnson

(57) ABSTRACT

A method of forming a photovoltaic device that includes epitaxially growing a first conductivity type semiconductor material of a type III-V semiconductor on a semiconductor substrate. The first conductivity type semiconductor material continuously extending along an entirety of the semiconductor substrate in a plurality of triangular shaped islands; and conformally forming a layer of type III-V semiconductor material having a second conductivity type on the plurality of triangular shaped islands.

8 Claims, 6 Drawing Sheets

(51) Int. Cl.
*H01L 31/0693* (2012.01)
*H01L 31/0304* (2006.01)
*H01L 31/0352* (2006.01)

(52) U.S. Cl.
CPC .... *H01L 31/03529* (2013.01); *H01L 31/0693* (2013.01); *H01L 31/1848* (2013.01); *H01L 31/1852* (2013.01); *H01L 31/1856* (2013.01); *Y02E 10/544* (2013.01)

(58) Field of Classification Search
CPC ........... H01L 31/03048; H01L 31/0693; H01L 31/0304; H01L 31/1852; H01L 31/1856; H01L 31/1848; H01L 31/03529
USPC .................................................. 136/243–265
See application file for complete search history.

(56) References Cited

U.S. PATENT DOCUMENTS

| | | | | |
|---|---|---|---|---|
| 2007/0204902 A1* | 9/2007 | Dutta | ................... | H01L 31/0236 136/256 |
| 2008/0072958 A1* | 3/2008 | Dutta | ................... | H01L 31/0236 136/256 |
| 2009/0001412 A1* | 1/2009 | Nagai | ................... | H01L 31/184 257/184 |
| 2009/0057721 A1* | 3/2009 | Miura | ................. | H01L 31/1844 257/201 |
| 2011/0011438 A1* | 1/2011 | Li | ........................ | H01L 31/0687 136/244 |
| 2012/0104411 A1* | 5/2012 | Iza | .................... | H01L 31/02363 257/76 |
| 2015/0047702 A1* | 2/2015 | Gu | .................. | H01L 31/022408 136/256 |

OTHER PUBLICATIONS

Lee et al, Enhancing the Output Power of GaN-Based LEDs Grown on Wet-Etched Patterned Sapphire Substrates, May 2006, IEEE Photonics Technology Letters, vol. 18 No. 10, 1152-1154. (Year: 2006).*

Sung et al, High rate etching of sapphire wafer using Cl2/BCl3/Ar inductively coupled plasmas, 2001, Materials Science and Engineering, B82, 50-52 (Year: 2001).*

Alves et al, Compensation mechanism in MOCVD and MBE grown GaN:Mg, 2001, Physica B 308-310, 38-41. (Year: 2001).*

List of IBM Patents or Patent Applications Treated as Related dated Dec. 7, 2017, 2 pages.

* cited by examiner

MONOLITHICALLY INTEGRATED HIGH VOLTAGE PHOTOVOLTAICS WITH TEXTURED SURFACE FORMED DURING THE GROWTH OF WIDE BANDGAP MATERIALS

BACKGROUND

Technical Field

The present invention generally relates to photovoltaic devices, and more particularly to photovoltaic devices including wide bandgap materials.

Description of the Related Art

A photovoltaic device is a device that converts the energy of incident photons to electromotive force (e.m.f.). Photovoltaic devices include solar cells, which are configured to convert the energy in the electromagnetic radiation from the sun to electric energy.

SUMMARY

In one aspect, a method of forming a photovoltaic device including wide bandgap materials is disclosed. In some embodiments, the method may include epitaxially growing a first conductivity type semiconductor material of a type III-V semiconductor on a substrate, the first conductivity type semiconductor material continuously extending along an entirety of the semiconductor substrate in a plurality of triangular shaped islands; and conformally forming a layer of type III-V semiconductor material having a second conductivity type on the plurality of triangular shaped islands.

In another embodiment, a method of forming a photovoltaic device including wide bandgap materials is described. In one embodiment, the method includes forming a textured surface on a substrate, the textured surface including a plurality of triangular shaped peaks. In some embodiments, the method continuous with conformally forming a first conductivity type III-V semiconductor material on the textured surface of the substrate. Thereafter, a second conductivity type III-V semiconductor material is conformally formed on the first conductivity type III-V semiconductor to produce a textured upper surface for the light receiving end of the photovoltaic device.

In another aspect, a photovoltaic device is provided a junction having an upper surface that is textured. In one embodiment, a first type III-V semiconductor material having a first conductivity type is in direct contact with a planar surface of a substrate. The first type III-V semiconductor material having the first conductivity type is a continuous layer of triangular geometry islands that are in contact end to end. A conformal layer of second type III-V semiconductor material having a second conductivity type is in direct contact with the first type III-V semiconductor material to provide a p-n junction, wherein the conformal layer over the continuous layer of triangular geometry islands provides the textured surface for the light receiving end of the photovoltaic device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
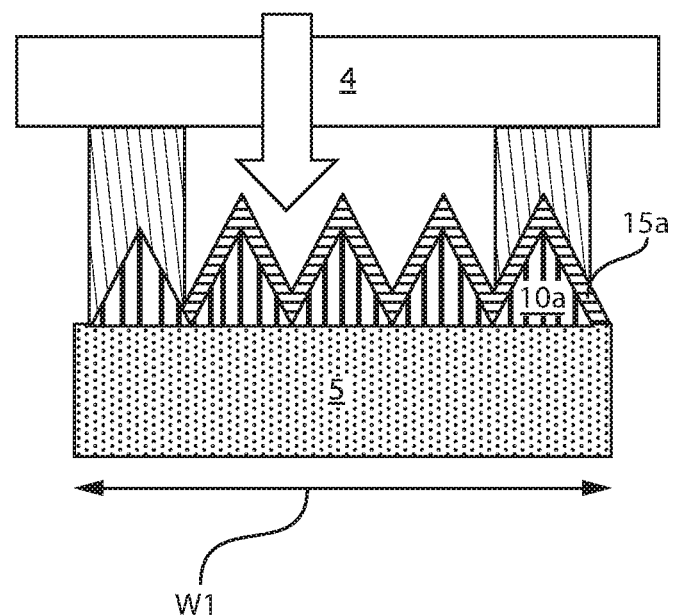
FIG. 1A is a side cross-sectional view showing one embodiment of a photovoltaic device including a textured upper surface, in which the junction for the photovoltaic device includes a continuous layer of n-type gallium nitride islands having a triangular shaped geometry atop a silicon containing substrate and a conformal p-type gallium nitride layer atop the n-type gallium nitride islands.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides photovoltaic cells, i.e., photovoltaic devices, needed for internet of things (IOT) applications. As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction.

Physically small, i.e., devices with a small footprint, having high voltage requirements are needed. The length and width dimensions of the monolithically formed devices of high voltage photovoltaics that are described herein may be no greater than 150 microns, e.g, may be equal to 100 microns or less.

In some embodiments, the voltage requirements can be met by a multi-junction photovoltaic cells, as depicted in FIGS. 1A-6B. The voltage requirements for a photovoltaic device of this type may require between 2 volts and 3 volts to drive light emitting diodes (LEDs) for communication applications. The voltage requirements to write and read memory cells may range from 2 volts to 3.5 volts. In battery applications, the photovoltaic devices may need to provide 3.5 volts to charge a battery.

In some embodiments, the structures and methods disclosed herein provide a high voltage photovoltaic device using wide bandgap semiconductor materials in combination with a growth and/or etching method that produces a surface texture for improved voltage and power output in a small footprint. The textured surface is present at the light receiving end of the photovoltaic device.

In some embodiments, the method of forming the photovoltaic device may begin with providing a substrate 5a, 5a', 5b, 5b', as depicted in FIGS. 1A-6B. In one embodiment, the substrate 5a may be a type IV semiconductor substrate, such as a silicon-containing substrate 5a. For example, the substrate may be composed of crystalline silicon (c-Si), e.g., polycrystalline silicon or single crystalline silicon, also referred to a monocrystalline silicon. In another embodiment, the substrate 5b may be composed of sapphire ($Al_2O_3$).

In some embodiments, the method may include epitaxially growing a first conductivity type semiconductor material of a type III-V semiconductor on the substrate 5a, 5b. The term "conductivity type" denotes whether a material is a p-type or n-type semiconductor material. As used herein, "p-type" refers to the addition of impurities to an intrinsic semiconductor that creates deficiencies of valence electrons. As used herein, "n-type" refers to the addition of impurities that contributes free electrons to an intrinsic semiconductor. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Figure 1B:
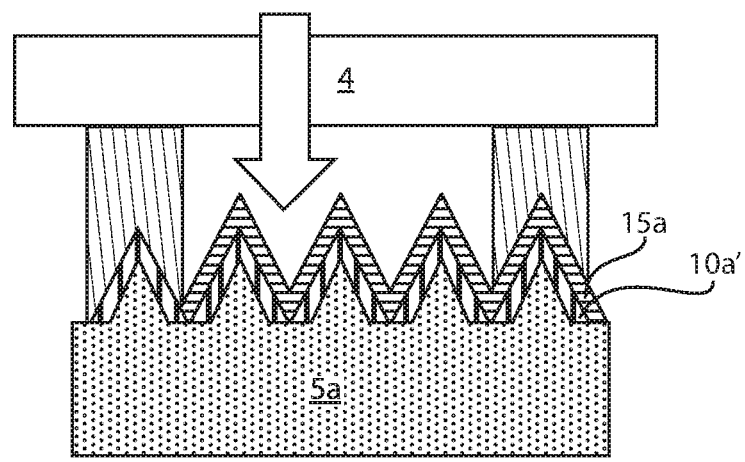
FIG. 1B is a side cross-sectional view showing one embodiment of a photovoltaic device including a textured upper surface, in which the silicon containing substrate has been etched to provide a textured upper surface and a junction for the photovoltaic device includes a n-type gallium nitride layer atop the textured upper surface of the substrate and a p-type gallium nitride layer atop the n-type gallium nitride layer.
Figure 2A:
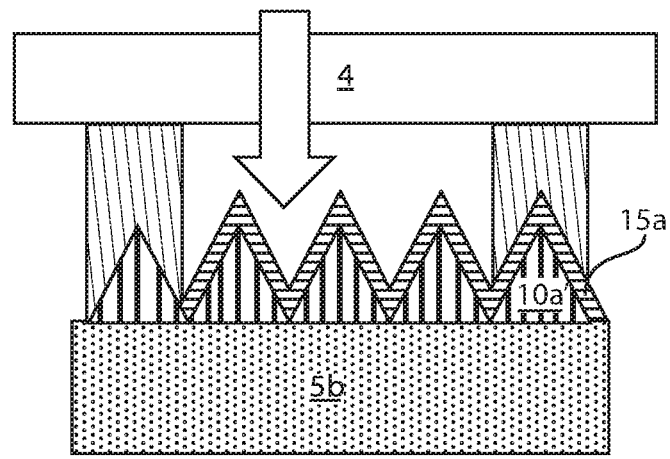
FIG. 2A is a side cross-sectional view showing one embodiment of a photovoltaic device including a textured upper surface, in which the junction for the photovoltaic device includes a continuous layer of n-type gallium nitride islands having a triangular shaped geometry atop a substrate composed of sapphire and a conformal p-type gallium nitride layer atop the n-type gallium nitride islands.
Figure 2B:
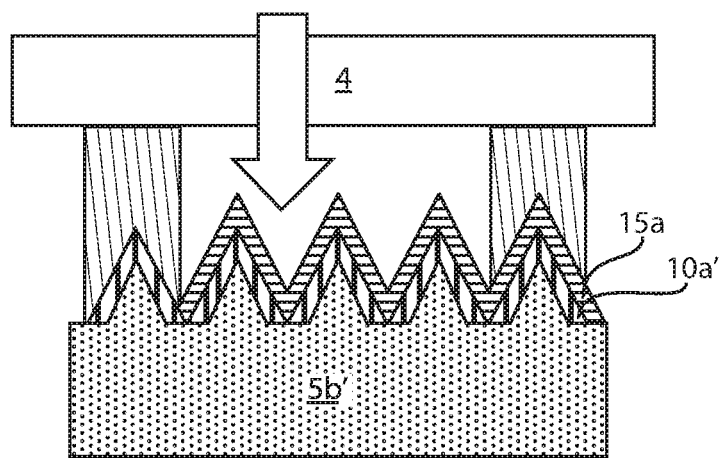
FIG. 2B is a side cross-sectional view showing one embodiment of a photovoltaic device including a textured upper surface, in which the sapphire substrate has been etched to provide a textured upper surface and a junction for the photovoltaic device includes a n-type gallium nitride layer atop the textured upper surface of the substrate and a p-type gallium nitride layer atop the n-type gallium nitride layer.
Figure 3A:
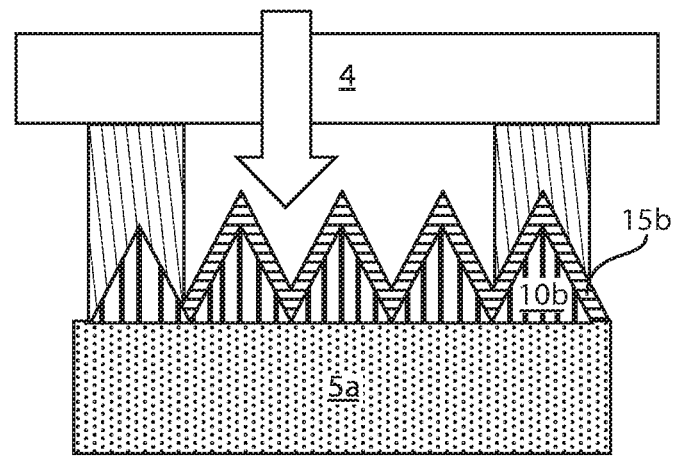
FIG. 3A is a side cross-sectional view showing one embodiment of a photovoltaic device including a textured upper surface, in which the junction for the photovoltaic device includes a continuous layer of n-type aluminum gallium nitride islands having a triangular shaped geometry atop a silicon containing substrate and a conformal p-type aluminum gallium nitride layer atop the n-type aluminum gallium nitride islands.
Figure 3B:
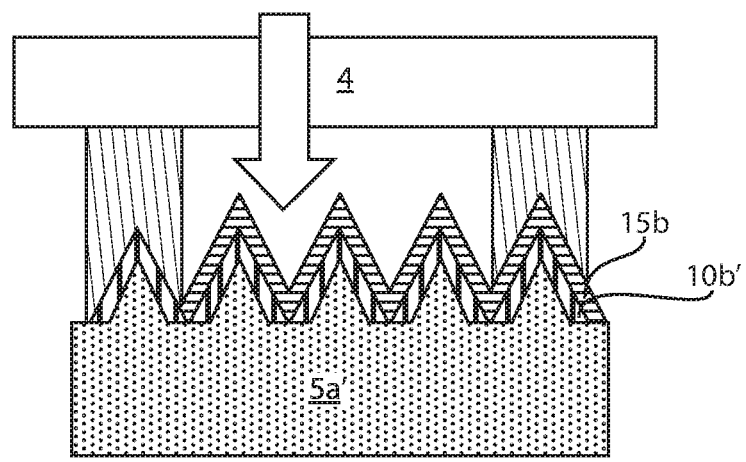
FIG. 3B is a side cross-sectional view showing one embodiment of a photovoltaic device including a textured upper surface, in which the silicon containing substrate has been etched to provide a textured upper surface and a junction for the photovoltaic device includes a n-type aluminum gallium nitride layer atop the textured upper surface of the substrate and a p-type aluminum gallium nitride layer atop the n-type aluminum gallium nitride layer.
Figure 4A:
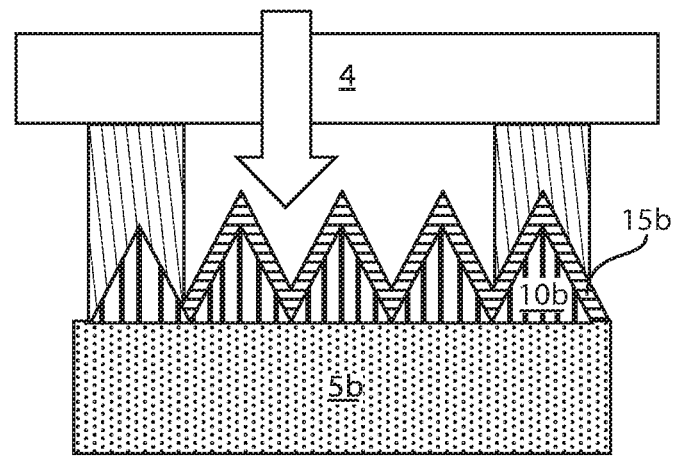
FIG. 4A is a side cross-sectional view showing one embodiment of a photovoltaic device including a textured upper surface, in which the junction for the photovoltaic device includes a continuous layer of n-type aluminum gallium nitride islands having a triangular shaped geometry atop a substrate composed of sapphire and a conformal p-type aluminum gallium nitride layer atop the n-type aluminum gallium nitride islands.
Figure 4B:
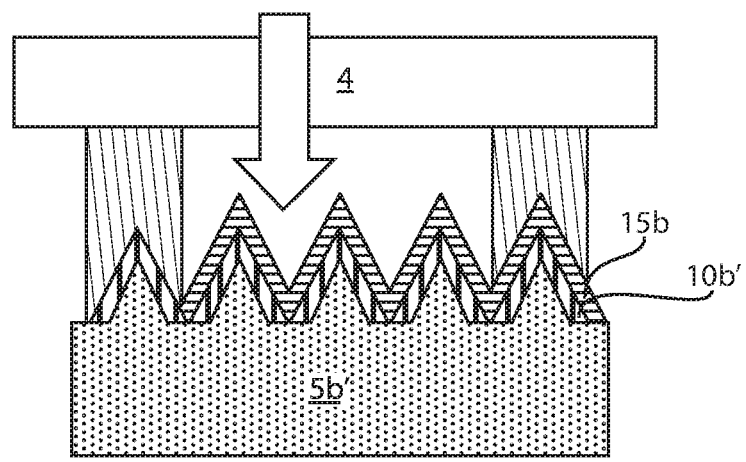
FIG. 4B is a side cross-sectional view showing one embodiment of a photovoltaic device including a textured upper surface, in which the sapphire substrate has been etched to provide a textured upper surface and a junction for the photovoltaic device includes a n-type aluminum gallium nitride layer atop the textured upper surface of the substrate and a p-type aluminum gallium nitride layer atop the n-type aluminum gallium nitride layer.
Figure 5A:
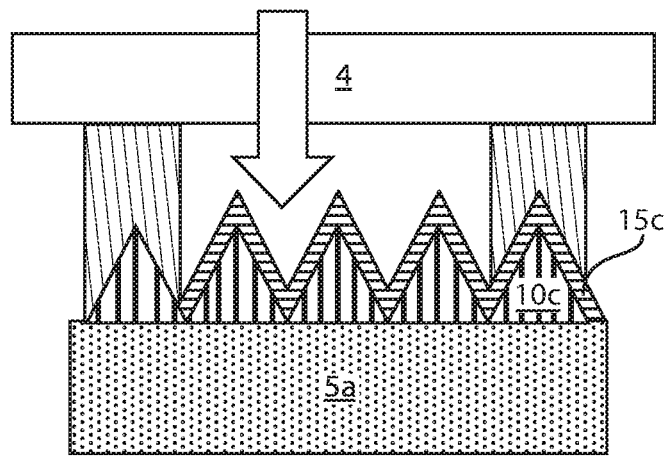
FIG. 5A is a side cross-sectional view showing one embodiment of a photovoltaic device including a textured upper surface, in which the junction for the photovoltaic device includes a continuous layer of n-type aluminum nitride islands having a triangular shaped geometry atop a silicon containing substrate and a conformal p-type aluminum nitride layer atop the n-type aluminum nitride islands.
Figure 5B:
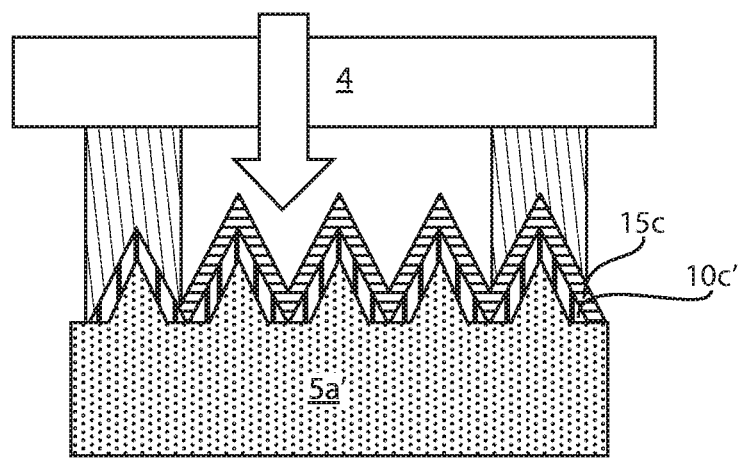
FIG. 5B is a side cross-sectional view showing one embodiment of a photovoltaic device including a textured upper surface, in which the silicon containing substrate has been etched to provide a textured upper surface and a junction for the photovoltaic device includes a n-type aluminum nitride layer atop the textured upper surface of the substrate and a p-type aluminum nitride layer atop the n-type aluminum nitride layer.
Figure 6A:
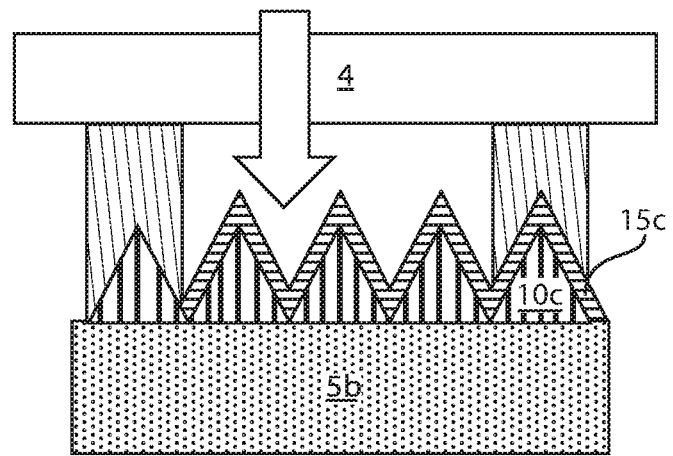
FIG. 6A is a side cross-sectional view showing one embodiment of a photovoltaic device including a textured upper surface, in which the junction for the photovoltaic device includes a continuous layer of n-type aluminum nitride islands having a triangular shaped geometry atop a substrate composed of sapphire and a conformal p-type aluminum nitride layer atop the n-type aluminum nitride islands.
Figure 6B:
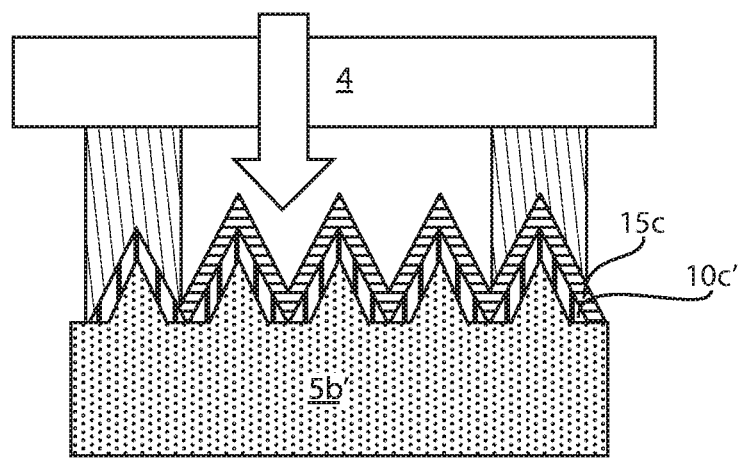
FIG. 6B is a side cross-sectional view showing one embodiment of a photovoltaic device including a textured upper surface, in which the sapphire substrate has been etched to provide a textured upper surface and a junction for the photovoltaic device includes a n-type aluminum nitride layer atop the textured upper surface of the substrate and a p-type aluminum nitride layer atop the n-type aluminum nitride layer.

In a type III-V semiconductor material, the effect of the dopant atom, i.e., whether it is a p-type or n-type dopant, depends upon the site occupied by the dopant atom on the lattice of the base material. In a III-V semiconductor material, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities In the embodiment depicted in FIGS. 1A and 1B, the first conductivity type semiconductor material of a type III-V semiconductor is an n-type gallium nitride layer 10a having islands of a triangular geometry that is present on a silicon substrate 5a, 5a'. In FIGS. 2A and 2B, the first conductivity type semiconductor material of a type III-V semiconductor is an n-type gallium nitride layer 10a having islands of a triangular geometry that is present on a sapphire substrate 5b, 5b'. In FIGS. 3A and 3B, the first conductivity type semiconductor material of a type III-V semiconductor is an n-type aluminum gallium nitride layer 10b having islands of a triangular geometry that is present on a silicon substrate 5a, 5b'. In FIGS. 4A and 4B, the first conductivity type semiconductor material of a type III-V semiconductor is an n-type aluminum gallium nitride layer 10b having islands of a triangular geometry that is present on a sapphire substrate 5b. In FIGS. 5A and 5B, the first conductivity type semiconductor material of a type III-V semiconductor is an n-type aluminum nitride layer 10c having islands of a triangular geometry that is present on a silicon substrate 5a, 5a'. In FIGS. 6A and 6B, the first conductivity type semiconductor material of a type III-V semiconductor is an n-type aluminum nitride layer 10c having islands of a triangular geometry that is present on a sapphire substrate 5b, 5b'. The triangular shaped geometry that is depicted in the cross-sections illustrated in FIGS. 1A-6A may also be referred to as pyramids.

In each of the embodiments depicted in FIGS. 1A-6A, the first conductivity type semiconductor material 10a, 10b, 10c that is formed on a substrate 5a, 5b having a planar upper surface, continuously extends along an entirety of the planar substrate surface in a plurality of triangular shaped islands. The triangular shaped islands have base surface in direct contact with the substrate 5a, 5b, and two sidewalls S1, S2 that are substantially straight extending from ends of the base surface and intersecting at an apex A1. In some embodiments, the apex A1 of the triangular geometry of first conductivity type semiconductor material 10a, 10b, 10c is positioned at a center of the width of the base surface. The term "continuous" as used to describe the layer of triangular shaped islands that provide the first conductivity type semiconductor material 10a, 10b, 10c means that the triangular shaped islands that are adjacent to one another contact each other end to end at the edges of the base surfaces of the triangular shaped islands.

In each of the embodiments depicted in FIGS. 1B-6B, the substrate 5a', 5b' is textured. In these embodiments, the texture of the upper surface of the substrate may have an apex similar and sidewall structure similar to a triangle, and can be referred to as a pyramid. In these embodiments, by conformally depositing the material layers for the p-n junction on the textured surface of the substrate 5a', 5b', the texture is communicated from the upper surface of the substrate 5a', 5b'; through the p-n junction so that the upper surface of the p-n junction is textured similar to the substrate 5a', 5b'.

Forming the first conductivity type semiconductor material of a type III-V semiconductor can begin with preparing the substrate 5a, 5b to be conductive for forming the islands of the triangular shaped geometry thereon. For example, referring to FIGS. 1B, 3B, and 5B, in the case of a Si-based substrate material, e.g., silicon containing substrate 5a', the pyramids can be formed using an etchant with crystal plane selectivity. For example, potassium hydroxide (KOH) etching is can be used to form pyramidal surface structures on the silicon substrate 5a'. In some embodiments, the silicon substrate 5a' crystal orientation is selected to be <111> when used for GaN growth, as depicted in FIG. 1B, in which the first conductivity type semiconductor material of a type III-V semiconductor is an n-type gallium nitride layer 10a having islands of a triangular geometry that is formed on a silicon substrate 5a'.

In the case of sapphire ($Al_2O_3$) substrates 5b', as depicted in FIGS. 2B, 4B, and 6B, the texturing is performed using lithographic definition of the pattern array, followed by dry etching to form pyramids. Some embodiments of dimensions for the pyramids are between 0.5 and 5 um tall and from 1 to 10 um wide at the base. The sapphire crystal orientation is usually <0001> "c-axis", although m-axis (semi-polar) orientations are considered as well.

In other embodiments, the textured surface is using a 2-step growth process wherein a first layer of III-V semiconductor material is grown, i.e., epitaxially formed, on a planar upper surface of the substrate 5a, 5b, i.e., silicon or sapphire substrate, as depicted in FIGS. 1A, 2A, 3A, 4A, 5A and 6A. For example, a first layer of III-V semiconductor material, such as n-type gallium nitride can be grown, e.g., epitaxially grown, to a thickness ranging from 0.5 microns to 10 microns. Thereafter, the substrate 5a, 5b including the first layer of the III-V semiconductor material that has been epitaxially formed thereon can be removed from the growth chamber of the epitaxial deposition apparatus, and can be either wet or dry etched to form a textured surface. Examples of wet etch chemistries suitable for etching gallium nitride (GaN) into a continuous layer of islands having a triangular geometry can include potassium hydroxide (KOH) or hydrogen peroxide ($H_2O_2$). Some embodiments of dimensions of the pyramids, i.e., each island having a triangular geometry, are between 0.5 microns and 5 microns tall and from 1 to 10 microns wide at the base.

The material layers of the lower layer of the junction, i.e., the n-type gallium nitride layer 10a, n-type aluminum gallium nitride layer 10b, and n-type aluminum nitride layer 10c may be formed using epitaxial growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The lower layer for the p-n junction may be formed by metal organic chemical vapor deposition (MOCVD) or molecular beam epitaxy (MBE). In some embodiments, the lower layer for the p-n junction may be formed using a low hydrogen deposition process. The term "low hydrogen" denotes that the deposition step has a maximum hydrogen content of $1 \times 10^{18}$ cm$^{-3}$.

MBE growth processes can include heat the substrate, typically to some hundreds of degrees (for example, 500° C.-600° C.) in the case of gallium nitride). In a following step, MBE growth processes include a precise beam of atoms or molecules (heated up so they're in gas form) being fired at the substrate from "guns" called effusion cells. The composition of the molecules being fired in the beams provide the composition of the deposited material layer. The molecules land on the surface of the substrate, condense, and build up systematically in ultra-thin layers, so that the material layer being grown forms one atomic layer at a time.

Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some preferred embodiments, the CVD process used to form the lower junction may be metal organic chemical vapor deposition.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), Trimethylaluminum (TMA), tertiary-butylphosphine (TBP), phosphine (PH$_3$), ammonia (NH$_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

The material layers for the lower layer of the p-n junction may be doped n-type or p-type using in situ doping. In the examples depicted in FIGS. 1A-6B, the lower layer of the p-n junction that is present on the substrate is n-type doped. By "in-situ" it is meant that the dopant that provides the conductivity type of the material layer, e.g., material layer that contributes to providing a junction, is introduced as the material layer is being formed. To provide for in-situ doped p-type or n-type conductivity, the dopant gas may be selected from the group consisting of bis-cyclopentadienyl-magnesium (Cp$_2$Mg), silane (SiH$_4$), disilane (Si$_2$H$_6$), germane (GeH$_4$), carbon tetrabromide (CBr$_4$) and combinations thereof.

The pitch of the pyramids, i.e., the pyramids of the textured surface of the substrate 5a', 5b' depicted FIGS. 1B, 2B, 3B, 4B, 5B and 6B, and the pitch of the pyramids of the n-type gallium nitride layer 10a, n-type aluminum gallium nitride layer 10b, and n-type aluminum nitride layer 10c depicted in FIGS. 1A, 2A, 3A, 4A, 5A and 6A, can be tuned through growth conditions or pre-patterning to maximize the light trapping for photovoltaic device. The preferred pyramid pitch is in the range of a few hundred nanometers, e.g., 100 nm to 500 nm, to match with the wavelength of the light that is subjected to the photovoltaic device.

In some embodiments, the pitch for the texturing is selected so that the base of adjacent pyramids abut one another so that no portion of the pyramid surface is orthogonal to the direction of light incidence. This permits the most number of surface interactions with an incident source.

Following the formation of the lower layer of the p-n junction, the upper layer may be formed using an epitaxial growth process. The epitaxial growth process that has been described above for forming the lower layer of the p-n junction is suitable for describing the epitaxial growth process for forming the upper layer of the p-n junction. The upper layer of the p-n junction has an opposite conductivity type as the lower layer of the p-n junction. The upper layer of the p-n junction may be referred to as having a second conductivity type. In the embodiment depicted in FIGS. 1A and 1B, the second conductivity type semiconductor material of a type III-V semiconductor is a p-type gallium nitride layer 15a having islands of a triangular geometry that is present on a silicon substrate 5b, 5b'. In FIGS. 2A and 2B, the second conductivity type semiconductor material of a type III-V semiconductor is an p-type gallium nitride layer 15a having islands of a triangular geometry that is present on a sapphire substrate 5b, 5b'. In FIGS. 3A and 3B, the second conductivity type semiconductor material of a type III-V semiconductor is a p-type aluminum gallium nitride layer 15b having islands of a triangular geometry that is present on a silicon substrate 5a, 5b'. In FIGS. 4A and 4B, the second conductivity type semiconductor material of a type III-V semiconductor is a p-type aluminum gallium nitride layer 15b having islands of a triangular geometry that is present on a sapphire substrate 5b. In FIGS. 5A and 5B, the second conductivity type semiconductor material of a type III-V semiconductor is a p-type aluminum nitride layer 15c having islands of a triangular geometry that is present on a silicon substrate 5a, 5a'. In FIGS. 6A and 6B, the second conductivity type semiconductor material of a type III-V semiconductor is an p-type aluminum nitride layer 15c having islands of a triangular geometry that is present on a sapphire substrate 5b, 5b'. The triangular shaped geometry that is depicted in the cross-sections illustrated in FIGS. 1A-6A may also be referred to as pyramids. The upper layer of the p-n junction can have a thickness ranging from 0.1 to 5 um thick.

After formation of the p-n junction, the wafer can then be subjected to a high temperature anneal in nitrogen (N$_2$) to drive the residual hydrogen (H) out of the wafer thereby electrically activating material layers of the p-n junction for the photovoltaic device. In any of the cases above, then texturing, i.e., pyramids, serve to reduce reflectivity of the surface thereby increasing photon absorption.

The p-n junction may be patterned and etched to expose the lower junction layer. For example, a photoresist mask may be formed on the uppermost semiconductor layer by applying a photoresist layer, exposing the photoresist layer to a pattern of radiation, and then developing the pattern into the photoresist layer utilizing conventional resist developer. The exposed portions of the semiconductor material layers that provide the upper junction layer may then be etched using an etch process, such as an anisotropic etch, e.g., reactive ion etch (RIE), or an isotropic etch, such as a wet chemical etch. The etch process exposes a lower of the lower junction layer that is to be electrically contacted.

Thereafter, the contacts 21, 22 may be formed to each of the upper and lower junction layers, i.e., photovoltaic device, using deposition, photolithography and etching processes. For example, a metal layer can be deposited using a physical vapor deposition (PVD) process. The PVD process may include plating, electroplating, electroless plating and combinations thereof. The deposited metal layers may be patterned and etched using deposition, photolithography and etching to provide the desired geometry of the contacts 21, 22.

FIGS. 1A-2B depict one embodiments of a photovoltaic device including a textured upper surface, in which the junction for the photovoltaic device includes a junction of n-type gallium nitride and p-type gallium nitride. The photovoltaic device\that is depicted in FIGS. 1A-2B when receiving a light wavelength ranging from 250 nm to 350 nm can provide a voltage that is greater than 2.0 eV. In yet other examples, the voltage produced by the photovoltaic device is greater than 2.25 eV. For example, the photovoltaic device 10 that includes the junction of the n-type gallium nitride (GaN) layer and the p-type gallium nitride (GaN) layer that is depicted in FIGS. 1A-2B may produce a voltage of 2.5 V or greater. It is noted that the above examples are provided for illustrative purposes only, and are not intended to limit the present disclosure. In other examples, the voltage produced by the photovoltaic device composed of the n-type and p-type conductivity gallium nitride (GaN) layers depicted in FIGS. 2A-2B may be equal to 2.0 V, 2.25 V, 2.5 V, 2.75 V, 3.0 V, 3.25 V, and 3.5 V, as well as any value between the aforementioned examples, and any range of voltages having a lower limit provided by one of the aforementioned example voltages, and an upper limit provided by one of the aforementioned example voltages.

FIGS. 3A-4B depict one embodiments of a photovoltaic device including a textured upper surface, in which the junction for the photovoltaic device includes a junction of n-type aluminum gallium nitride and p-type aluminum gallium nitride. The photovoltaic device that is depicted in FIGS. 3A-4B when receiving a light wavelength ranging from 200 nm to 300 nm can provide a voltage that is greater than 2.5 V. In yet other examples, the voltage provided is greater than 3.0 V. For example, the photovoltaic device that is depicted in FIGS. 3A-4B that is composed of a junction of n-type and p-type aluminum gallium nitride (AlGaN) layers may provide a voltage of 3.5 V or greater. It is noted that the prior examples are provided for illustrative purposes only, and are not intended to limit the present disclosure. In other examples, the voltage provided by a photovoltaic device composed of a junction of n-type and p-type conductivity aluminum gallium nitride (AlGaN), as depicted in FIGS. 3A-3B, may be equal to 2.5 V, 2.75 V, 3.0 V, 3.25 V and 3.5V, as well as any value between the aforementioned examples, and any range of voltages having a lower limit provided by one of the aforementioned examples, and an upper limit provided by one of the aforementioned examples.

FIGS. 5A-6B depict one embodiments of a photovoltaic device including a textured upper surface, in which the junction for the photovoltaic device includes a junction of n-type aluminum nitride and p-type aluminum nitride. The photovoltaic device that is depicted in FIGS. 5A-6B when receiving a light wavelength ranging from 200 nm to 300 nm can provide a voltage that is greater than 2.5 V. In yet other examples, the voltage provided is greater than 3.0 V. For example, the photovoltaic device that is depicted in FIG. 5A-6B that are each composed of a junction of n-type and p-type aluminum nitride (AlN) layers may provide a voltage of 3.5 V or greater. It is noted that the prior examples are provided for illustrative purposes only, and are not intended to limit the present disclosure. In other examples, the voltage provided by each of the photovoltaic device composed of a junction of n-type and p-type conductivity aluminum nitride (AlN) may be equal to 2.5 V, 2.75 V, 3.0 V, 3.25 V and 3.5V, as well as any value between the aforementioned examples, and any range of voltages having a lower limit provided by one of the aforementioned examples, and an upper limit provided by one of the aforementioned examples.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a photovoltaic device comprising:
forming a plurality of triangular shaped islands on the sapphire substrate using a dry etchant, wherein each of the plurality of the triangular shaped islands have a microscale width ranging from 1 micron to 10 microns, and said each of the triangular shaped islands are separated from one another by a planar portion of the sapphire substrate, wherein the sapphire substrate has a <0001> c-axis orientation;
epitaxially growing a first conductivity type semiconductor material of a type III-V semiconductor on a sapphire substrate, the first conductivity type semiconductor material continuously extending along an entirety of the sapphire substrate, said epitaxially growing comprising low hydrogen molecular beam epitaxial (MBE) deposition, wherein hydrogen is present in said low hydrogen molecular beam epitaxial (MBE) deposition in an amount up to a maximum of $1\times10^{18}$ $cm^{-3}$; and
conformally forming a layer of type III-V semiconductor material having a second conductivity type on the plurality of triangular shaped islands.

2. The method of claim 1, wherein the first conductivity type is n-type, the second conductivity type is p-type and the layer of type III-V semiconductor material layer is gallium nitride.

3. The method of claim 1, wherein the first conductivity type is n-type, the second conductivity type is p-type and the layer of type III-V semiconductor material layer is aluminum gallium nitride.

4. The method of claim 1, wherein the first conductivity type is n-type, the second conductivity type is p-type and the layer of type III-V semiconductor material layer is aluminum nitride.

5. A method of forming a photovoltaic device comprising:
forming a textured surface on a sapphire substrate using a dry etchant, the textured surface including a plurality of triangular shaped peaks, wherein each of the plurality of the triangular shaped peaks have a microscale width ranging from 1 micron to 10 microns, and said each of the triangular shaped peaks are separated from one another by a planar portion of the sapphire substrate, wherein the sapphire substrate has a <0001> c-axis orientation;
conformally forming a first conductivity type III-V semiconductor material on the textured surface of the sapphire substrate, said conformally forming comprising low hydrogen molecular beam epitaxial (MBE) deposition, wherein hydrogen is present in said low hydrogen molecular beam epitaxial (MBE) deposition in an amount up to a maximum of $1\times10^{18}$ $cm^{-3}$; and
conformally forming a second conductivity type III-V semiconductor material on the first conductivity type III-V semiconductor material to produce a textured surface for a light receiving end of the photovoltaic device.

6. The method of claim 5, wherein the first conductivity type is n-type, the second conductivity type is p-type and the type III-V semiconductor material layer of one of the first conductivity type III-V semiconductor material and the second conductivity type III-V semiconductor material is gallium nitride.

7. The method of claim 5, wherein the first conductivity type is n-type, the second conductivity type is p-type and the type III-V semiconductor material layer of one of the first conductivity type III-V semiconductor material and the second conductivity type III-V semiconductor material is aluminum gallium nitride.

8. The method of claim 5, wherein the first conductivity type is n-type, the second conductivity type is p-type and the type III-V semiconductor material layer of one of the first conductivity type III-V semiconductor material and the second conductivity type III-V semiconductor material is aluminum nitride.

* * * * *